United States Patent
Shigetaka et al.

(10) Patent No.: US 10,298,231 B2
(45) Date of Patent: May 21, 2019

(54) INPUT DEVICE

(71) Applicant: ALPS ALPINE CO., LTD., Tokyo (JP)

(72) Inventors: Hiroshi Shigetaka, Miyagi (JP); Kunio Sato, Miyagi (JP); Hiroaki Takahashi, Miyagi (JP); Heishiro Fudo, Miyagi (JP); Jo Ri, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 0 days.

(21) Appl. No.: 15/828,947

(22) Filed: Dec. 1, 2017

(65) Prior Publication Data

US 2018/0183438 A1     Jun. 28, 2018

(30) Foreign Application Priority Data

Dec. 28, 2016 (JP) ................. 2016-255533

(51) Int. Cl.
    *G06F 3/044*      (2006.01)
    *H03K 17/96*      (2006.01)

(52) U.S. Cl.
     CPC ....... *H03K 17/9618* (2013.01); *H03K 17/962* (2013.01); *H03K 17/964* (2013.01)

(58) Field of Classification Search
     CPC ...... G06F 3/044; G06F 3/0416; G06F 3/0412; G06F 3/0418; G06F 2203/04103; G06F 3/0414; H03K 17/962; H03K 2217/960755; H03K 17/9622; H03K 17/975; H03K 2017/9613
     USPC .................................. 200/600; 345/172–174
     See application file for complete search history.

(56) References Cited

U.S. PATENT DOCUMENTS

| | | | | |
|---|---|---|---|---|
| 7,091,886 B2 * | 8/2006 | DePue | ................... | H03K 17/94 200/18 |
| 2015/0355771 A1 * | 12/2015 | Watazu | ................. | G06F 3/0414 345/174 |
| 2016/0195994 A1 * | 7/2016 | Kitada | .................... | G06F 3/044 345/174 |
| 2016/0299625 A1 * | 10/2016 | Kano | .................... | G06F 3/0414 |
| 2017/0228072 A1 * | 8/2017 | Amin | .................... | H01L 41/081 |

FOREIGN PATENT DOCUMENTS

JP     2014-209297     11/2014

\* cited by examiner

*Primary Examiner* — Ahmed M Saeed
(74) *Attorney, Agent, or Firm* — IPUSA, PLLC (57) ABSTRACT

An input device includes a capacitive sensor and a piezoelectric sensor. The piezoelectric sensor is positioned on the front side of the capacitive sensor in a front-to-back direction from the front to the back of the input device, and is configured to change its output in response to a force applied to the piezoelectric sensor from its front side. The piezoelectric sensor includes a piezoelectric layer and a first electrode and a second electrode positioned across the piezoelectric layer from each other in the front-to-back direction. The capacitive sensor includes a capacitive sensing area where the capacitive sensor is configured to perform a sensing operation. The first electrode and the second electrode of the piezoelectric sensor do not overlap the capacitive sensing area when viewed in the front-to-back direction.

8 Claims, 9 Drawing Sheets

INPUT DEVICE

CROSS-REFERENCE TO RELATED APPLICATION

This application is based upon and claims priority to Japanese Patent Application No. 2016-255533, filed on Dec. 28, 2016, the entire contents of which are incorporated herein by reference.

BACKGROUND OF THE INVENTION

1. Field of the Invention

The present invention relates to input devices including an input device that has a capacitive sensor and a piezoelectric sensor provided one over the other.

2. Description of the Related Art

Japanese Laid-open Patent Publication No. 2014-209297 describes a touchscreen having a pressing force measuring function.

This touchscreen includes a piezoelectric body and a support film placed over the piezoelectric body. Touchscreen-dedicated electrodes are provided on the upper side and the lower side of the support film. The support film is fixed onto the piezoelectric body through an adhesive agent.

This touchscreen has a force measuring function and a position detecting function. The force measuring function is executed by measuring electric power that is generated in the piezoelectric body when the surface of front glass is pressed with a finger or the like. The position detection is performed according to a projected capacitive touch technology using the touchscreen-dedicated electrodes when the surface of the front glass is pressed with a finger or the like.

SUMMARY OF THE INVENTION

According to an aspect of the present invention, an input device includes a capacitive sensor and a piezoelectric sensor. The piezoelectric sensor is positioned on the front side of the capacitive sensor in a front-to-back direction from the front to the back of the input device, and is configured to change its output in response to a force applied to the piezoelectric sensor from its front side. The piezoelectric sensor includes a piezoelectric layer and a first electrode and a second electrode positioned across the piezoelectric layer from each other in the front-to-back direction. The capacitive sensor includes a capacitive sensing area where the capacitive sensor is configured to perform a sensing operation. The first electrode and the second electrode of the piezoelectric sensor do not overlap the capacitive sensing area when viewed in the front-to-back direction.

The object and advantages of the invention will be realized and attained by means of the elements and combinations particularly pointed out in the claims.

It is to be understood that both the foregoing general description and the following detailed description are exemplary and explanatory and not restrictive of the invention.

DESCRIPTION OF EMBODIMENTS

According to the touchscreen described in Japanese Laid-open Patent Publication No. 2014-209297, the piezoelectric body is positioned under a projected capacitive touch sensor formed of the support film and the touchscreen-dedicated electrodes. As the curvature of the piezoelectric body at the time of flexural deformation due to an external force increases, the detection sensitivity increases. According to the touchscreen described in Japanese Laid-open Patent Publication No. 2014-209297, however, the piezoelectric body is positioned at a distance from the front glass on its back side. Therefore, the curvature of the piezoelectric body caused by pressing on the front glass is limited, thus making it difficult to increase detection sensitivity.

Furthermore, in the case of configuring a capacitive sensor, it is preferable to provide electrodes for capacitive sensing on the front side of a substrate and mount electronic components such as an integrated circuit (IC) chip containing a sensing circuit on the back side of the substrate. According to a structure where a piezoelectric body is provided on the back side of the capacitive sensor, however, an area for mounting electronic components including the IC chip is limited, thus making designing difficult.

According to an aspect of the present invention, an input device where a piezoelectric sensor is provided on the front side of a capacitive sensor to increase the pressing force detection sensitivity of the piezoelectric sensor and the position detection accuracy of the capacitive sensor is provided.

One or more embodiments of the present invention are described below with reference to the accompanying drawings. In the drawings, the direction indicated by the arrow X ("X direction") indicates a longitudinal direction of an input device, the direction indicated by the arrow Y ("Y direction") indicates a transverse direction of the input device, and the directions indicated by the arrows Z1 and Z2 ("Z1 and Z2 directions") indicates the back-to-front direction (from the back or back side to the front or front side) and the front-to-back direction (from the front or front side to the back or back side), respectively, of the input device. The Z1 and Z2 directions may be collectively referred to as "Z direction" where appropriate. The Z direction corresponds to the thickness direction of the input device. Furthermore, the X direction, the Y direction, and the Z direction may correspond to the X axis, the Y axis, and the Z axis of a Cartesian coordinate system.

Figure 1:
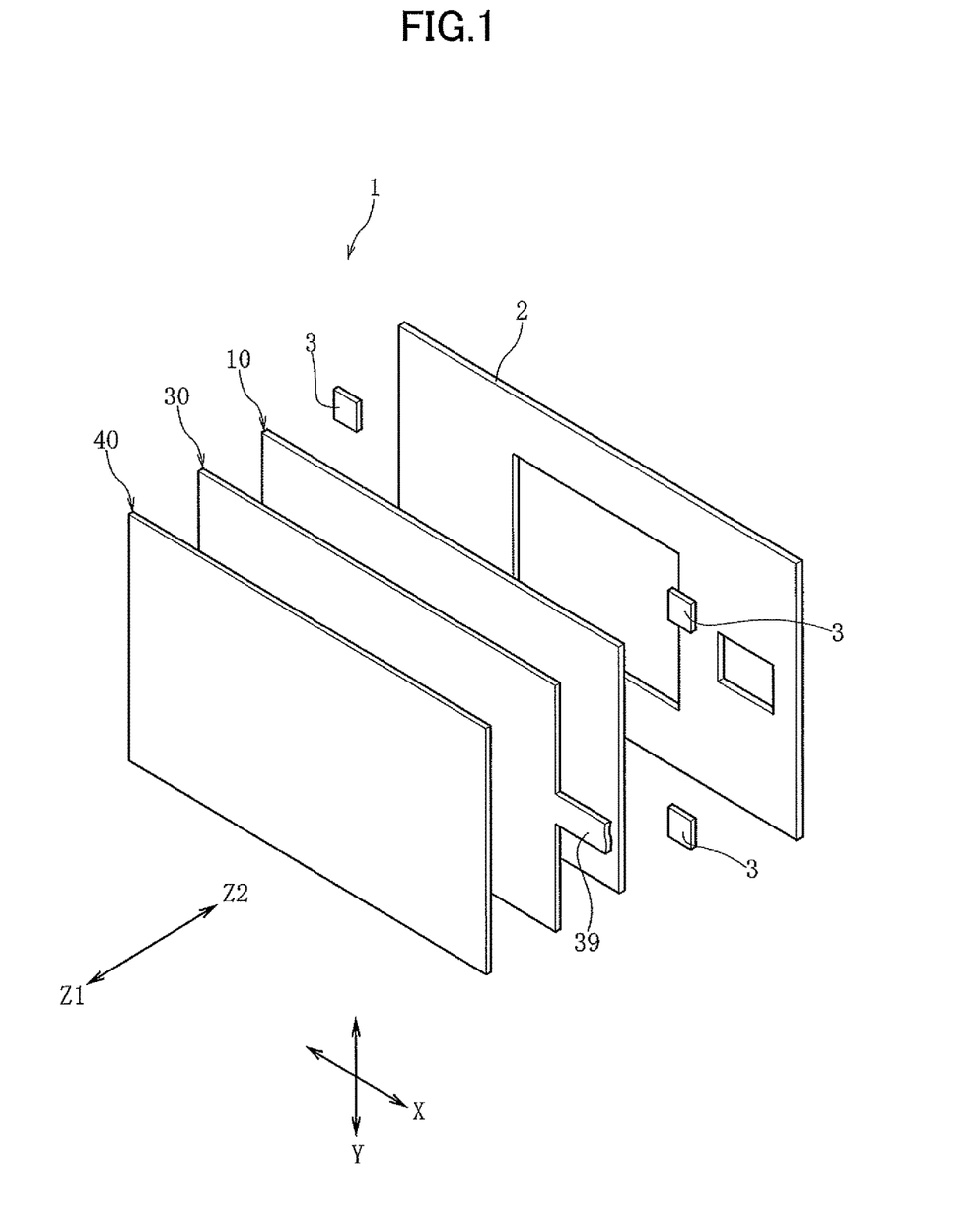
FIG. 1 is an exploded perspective view of an input device according to an embodiment of the present invention, illustrating the overall structure of the input device.

FIG. 1 is an exploded perspective view of an input device according to an embodiment of the present invention, illustrating the overall structure of the input device. An input device 1 depicted in FIG. 1 is mounted in, for example, a keyboard for a personal computer and used. The input device 1 may also be used for the input parts of various electronic devices other than keyboards. In addition, the input device 1 may be transparent in its entirety to be usable as an input device to be placed in front of a display panel such as a color liquid crystal panel.

Referring to FIG. 1, the input device 1 includes a metal chassis 2, a capacitive sensor 10, a piezoelectric sensor 30, and a surface sheet 40. The capacitive sensor 10, the piezoelectric sensor 30, and the surface sheet 40 are stacked in layers on the front side (facing in the Z1 direction) of the chassis 2. The capacitive sensor 10, the piezoelectric sensor 30, and the surface sheet 40 are rectangular. Cushion sheets 3 are interposed at four points between the chassis 2 and the capacitive sensor 10. The cushion sheets 3 are, for example, elastomer sheets or foamed resin sheets. The cushion sheets 3 are adhered between the four corners of the rectangular capacitive sensor 10 and the chassis 2. The front surface of the capacitive sensor 10 and the back surface of the piezoelectric sensor 30 are bonded together in their entirety by an adhesive layer. The front surface of the piezoelectric sensor 30 and the back surface of the surface sheet 40 are bonded together in their entirety by an adhesive layer.

Figure 2:
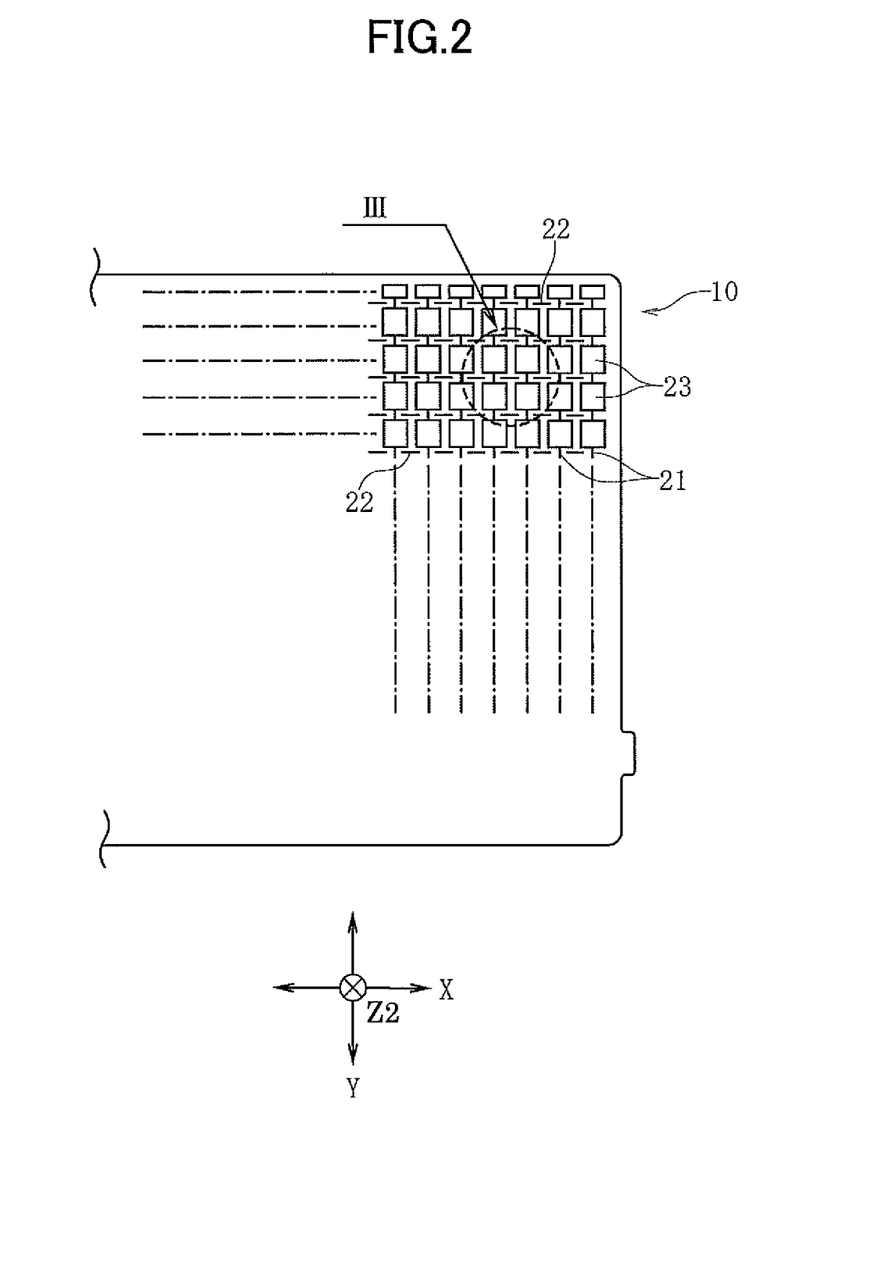
FIG. 2 is a front view of a capacitive sensor of the input device.
Figure 3:
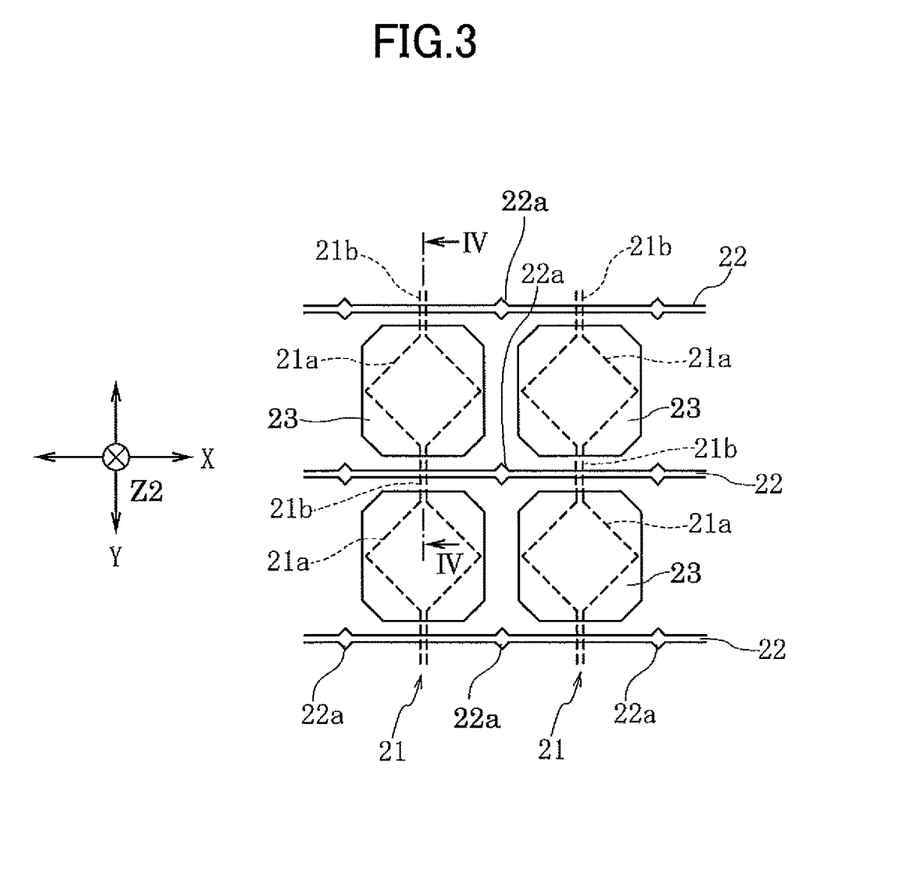
FIG. 3 is an enlarged front view of part III of FIG. 2, illustrating an electrode structure of the capacitive sensor.
Figure 4:
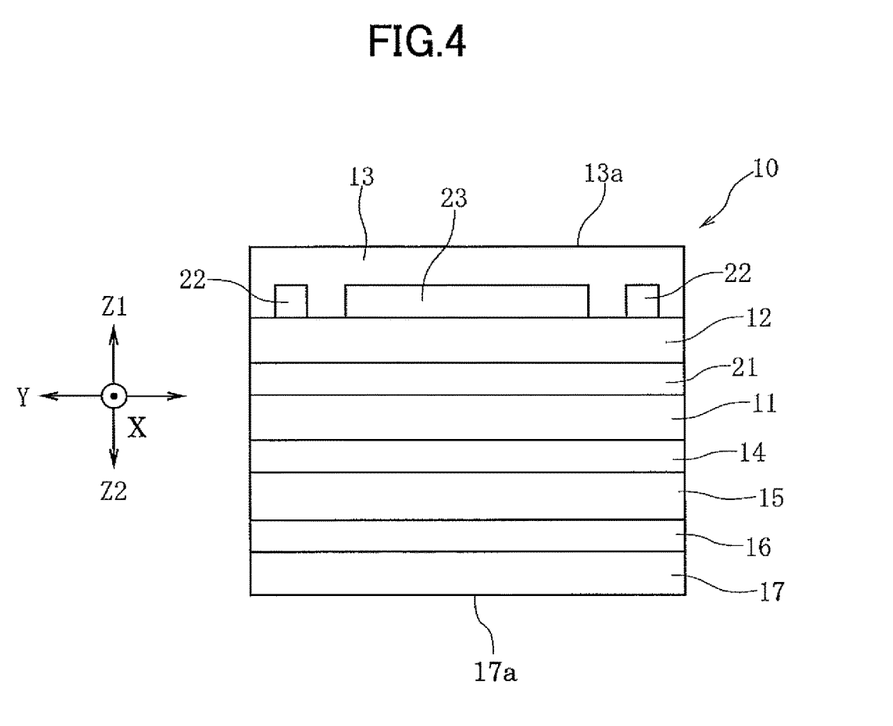
FIG. 4 is a cross-sectional view of the capacitive sensor, taken along the line IV-IV of FIG. 3, illustrating a layered structure of the capacitive sensor.

Next, a structure of the capacitive sensor 10 is described with reference to FIGS. 2 through 4. FIG. 2 is a front view of the capacitive sensor 10, looking at the front side (surface) of the capacitive sensor 10. FIG. 3 is an enlarged front view of part III of FIG. 2, illustrating an electrode structure of the capacitive sensor 10. FIG. 4 is a cross-sectional view of the capacitive sensor 10, taken along the line IV-IV of FIG. 3, illustrating a layered structure of the capacitive sensor 10. Referring to FIG. 4, the capacitive sensor 10 forms a multilayer rigid substrate, and has predetermined rigidity. When a pressing force acts on the capacitive sensor 10 in the front-to-back direction (the Z2 direction in FIG. 1), the capacitive sensor 10 can flex and deform with the four corners supported by the cushion sheets 3 serving as supports.

The capacitive sensor 10 includes an insulating substrate 11 of, for example, polycarbonate. Drive electrodes 21 that are electrodes for capacitive sensing are formed on the front surface of the insulating substrate 11 that faces forward (in the Z1 direction). The front surfaces of the drive electrodes 21 are covered with an inter-electrode insulating layer 12. Sense electrodes 22 that also are electrodes for capacitive sensing are formed on the front surface of the inter-electrode insulating layer 12 that faces forward. Furthermore, conductive patterns 23, which form a conductive layer, are formed one between each pair of adjacent sense electrodes 22 on the front surface of the inter-electrode insulating layer 12. The sense electrodes 22 and the conductive patterns 23 are covered with a front-side insulating layer 13.

Referring to FIG. 4, a shield electrode layer 14 set at ground potential is provided on the entirety of the back surface of the insulating substrate 11 that faces backward (in the Z2 direction). A first back-side insulating layer 15 is formed on the back surface of the shield electrode layer 14. A wiring layer 16 is formed on the back surface of the first back-side insulating layer 15. The back surface of the wiring layer 16 is covered with a second back-side insulating layer 17.

FIGS. 2 and 3 depict a planar pattern of the drive electrodes 21, the sense electrodes 22, and the conductive patterns 23, which are electrodes for capacitive sensing. These electrodes for capacitive sensing are famed by etching copper foil or by printing using silver paste.

The drive electrodes 21 are arranged at regular intervals in the X direction, each continuously extending in the Y direction. Referring to FIG. 3, each drive electrode 21 includes main electrode parts 21a having a quadrangular (rhombic) shape and connecting parts 21b connecting the main electrode parts 21a. The main electrode parts 21a and the connecting parts 21b alternate with each other in sequence to form a one-piece structure. The main electrode parts 21a are greater in width (the dimension in the X direction) than the connecting parts 21b.

The sense electrodes 22 are arranged at regular intervals in the Y direction, each continuously extending in the X direction. The sense electrodes 22 and the connecting parts 21b of the drive electrodes 21 cross each other with the inter-electrode insulating layer 12 interposed between the sense electrodes 22 and the drive electrodes 21. The sense electrodes 22 include sensing parts 22a where the sense electrodes 22 become slightly wider (in the Y direction). In each sense electrode 22, the sensing parts 22a are positioned one between each adjacent intersections with the drive electrodes 21.

The conductive patterns 23 are formed in the same layer as the sense electrodes 22 on the front surface of the inter-layer insulating layer 12 that faces forward (in the Z1 direction). The conductive patterns 23 are connected to neither the sense electrodes 22 nor the drive electrodes 21 positioned in a lower layer (the layer across the inter-layer insulating layer 12 from the conductive patterns 23). That is, the conductive patterns 23 are electrically disconnected from the drive electrodes 21 and the sense electrodes 22. The conductive patterns 23 are formed in the same process using the same electrically conductive material as the sense electrodes 22. Therefore, the front surfaces of the sense electrodes 22 (facing in the Z1 direction) and the front surfaces of the conductive patterns 23 (facing in the Z1 direction) are positioned in the same virtual plane parallel to the X-Y plane.

Because the front surfaces of the sense electrodes 22 and the front surfaces of the conductive patterns 23 positioned between the sense electrodes 22 are flush with each other, it is easier to flatten and smooth a front surface 13a of the front-side insulating layer 13 which covers the sense electrodes 22 and the conductive patterns 23. This makes it easier to prevent the piezoelectric sensor 30 in sheet form from being distorted when bonding the piezoelectric sensor 30 to the flat and smooth front surface 13a. Furthermore, while the conductive patterns 23 have a square shape and the main electrode parts 21a of the drive electrodes 21 have a rhombic shape, the main electrode parts 21a and the conductive patterns 23 are substantially equal in dimension in the X direction and the Y direction. When driving power is applied to the drive electrodes 21, the main electrode parts 21a of the drive electrodes 21 and the conductive patterns 23 positioned over the main electrode parts 21a are coupled through capacitance.

Referring to FIG. 4, the shield electrode layer 14 is formed of, for example, copper foil or silver paste to cover the entire area of the back surface of the insulating substrate 11 facing backward (in the Z2 direction). The wiring layer 16 forms multiple wiring lines electrically connected to the drive electrodes 21 and the sense electrodes 22. For example, an IC containing a drive circuit is mounted on a back surface 17a of the second back-side insulating layer 17 facing backward (in the Z2 direction), and the wiring lines are connected to the electrode parts of the IC, etc.

Figure 5:
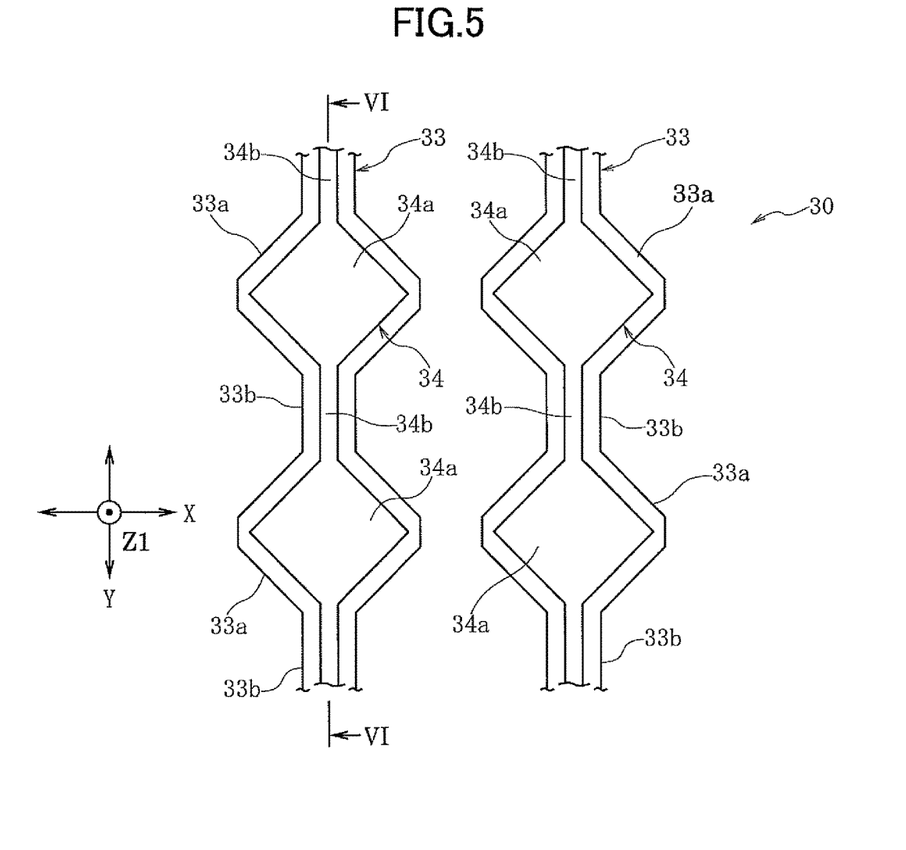
FIG. 5 is an enlarged front view of a piezoelectric sensor of the input device, illustrating an electrode pattern of the piezoelectric sensor.
Figure 6:
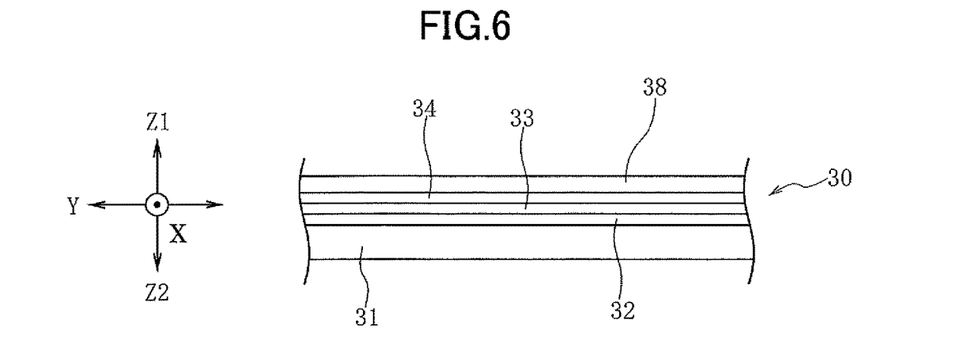
FIG. 6 is a cross-sectional view of the piezoelectric sensor, taken along the line VI-VI of FIG. 5, illustrating a layered structure of the piezoelectric sensor.
Figure 7:
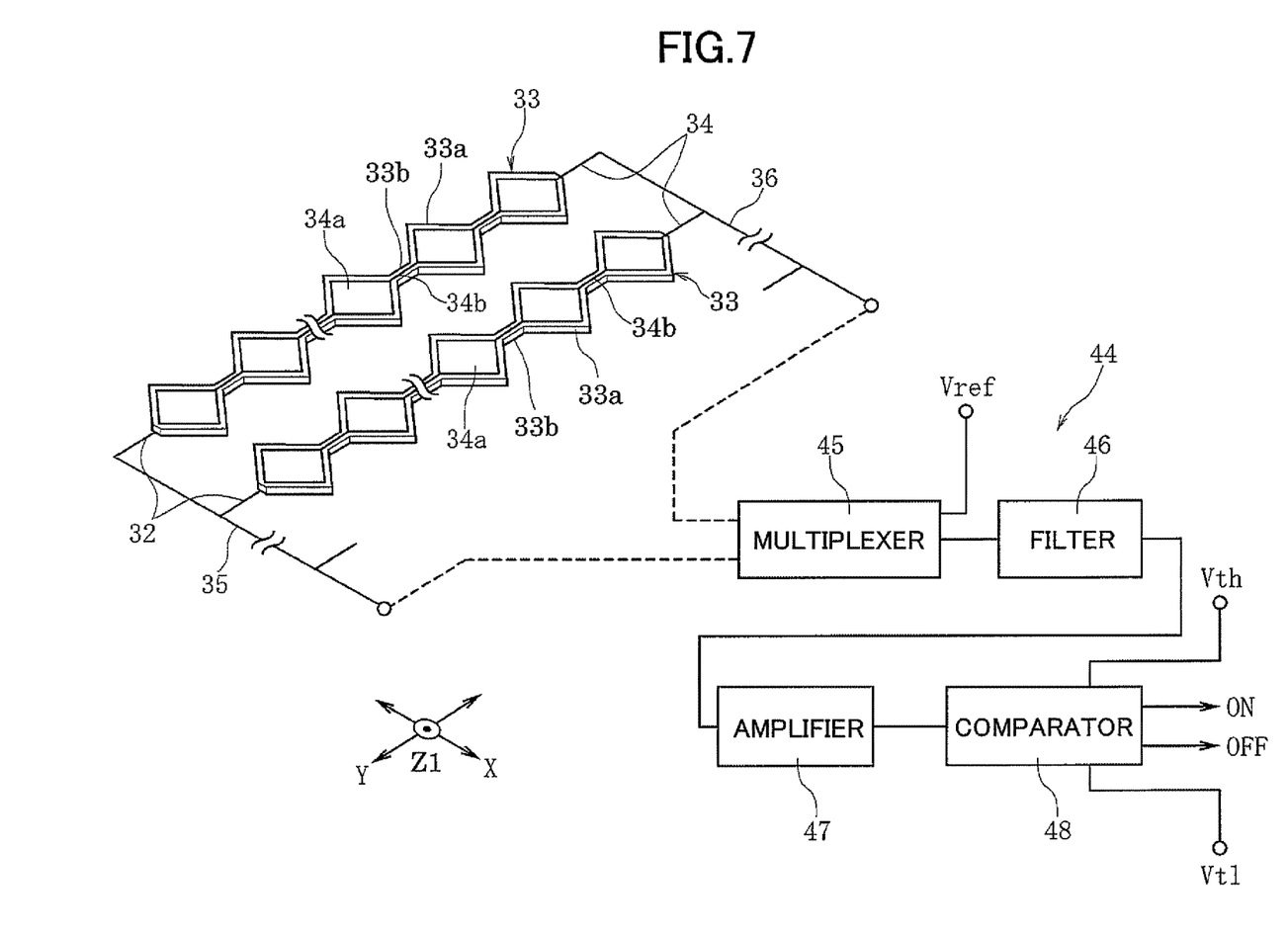
FIG. 7 is a circuit block diagram illustrating wiring and a drive and detection circuit of the piezoelectric sensor.

Next, a structure of the piezoelectric sensor 30 is described with reference to FIGS. 5 through 7. FIG. 5 is an enlarged front view of the piezoelectric sensor 30, illustrating an electrode pattern of the piezoelectric sensor 30. FIG. 6 is a cross-sectional view of the piezoelectric sensor 30, taken along the line VI-VI of FIG. 5, illustrating a layered structure of the piezoelectric sensor 30. FIG. 7 is a circuit block diagram illustrating wiring and a drive and detection circuit 44 of the piezoelectric sensor 30. Referring to FIG. 6, the piezoelectric sensor 30 is in sheet form, and includes a film substrate 31 formed of a synthetic resin material such as polyethylene terephthalate (PET), first electrodes 32, piezoelectric patterns 33 forming a piezoelectric layer, second electrodes 34, and an insulating coat 38. The first electrodes 32, the piezoelectric patterns 33, and the second electrodes 34 are stacked in layers in order in the back-to-front (Z1) direction on the front surface of the film substrate 31 facing forward (in the Z1 direction). The first electrodes 32 are carbon electrodes formed by screen printing. The piezoelectric patterns 33 are formed of piezoelectric paste on the first electrodes 32 by screen printing. The second electrodes 34 are formed on the piezoelectric patterns 33 by screen printing. The second electrodes 34 are covered with the insulating coat 38.

Examples of piezoelectric paste include mixture paste of perovskite ferroelectric powder of, for example, potassium niobate, sodium potassium niobate, or barium titanate and thermoplastic polyester urethane resin.

Referring to FIGS. 5 and 7, the piezoelectric patterns 33 are arranged at intervals in the X direction, each continuously extending in the Y direction, over the front surface of the film substrate 31. The piezoelectric patterns 33 include wide portions 33a and narrow portions 33b that are alternately formed in the Y direction. The second electrodes 34 are provided one on top of each piezoelectric pattern 33 to continuously extend in the Y direction together with the piezoelectric patterns 33. The second electrodes 34 as well include wide portions 34a and narrow portions 34b that are alternately formed in the Y direction. The first electrodes 32 and the second electrodes 34 are equal in shape and size, and are provided one over the other to coincide with each other in the Z direction. Thus, the first electrodes 32 as well include wide portions corresponding to the wide portions 34a and narrow portions corresponding to the narrow portions 34b.

Referring to FIG. 7, on the film substrate 31 of the piezoelectric sensor 30, a first electrode wiring layer (pattern) 35 electrically connected to all the first electrodes 32 and a second electrode wiring layer (pattern) 36 electrically connected to all the second electrodes 34 are provided inside the edges of the film substrate 31 along the X direction. Referring to FIG. 1, a narrow extension piece 39 extends from a transverse side of the piezoelectric sensor 30. The extension piece 39 is an extension of part of the film substrate 31. The first electrode wiring layer 35 and the second electrode wiring layer 36 are formed on a surface of the extension piece 39. The extension piece 39 is bent on the back side of the capacitive sensor 10 to be connected to the wiring layer 16 depicted in FIG. 4 or to the IC, etc., mounted on the back surface of the capacitive sensor 10. The first electrode wiring layer 35 and the second electrode wiring layer 36 are connected to the drive and detection circuit 44 contained in, for example, the IC.

Referring to FIG. 7, the drive and detection circuit 44 includes a multiplexer 45, a filter 46, an amplifier 47, and a comparator 48. The first electrode wiring layer 35 and the second electrode wiring layer 36 are connected to the multiplexer 45. One of the first electrode wiring layer 35 and the second electrode wiring layer 36 is connected to reference voltage Vref and the other of the first electrode wiring layer 35 and the second electrode wiring layer 36 is connected the filter 46 through the multiplexer 45. The detection output of the multiplexer 45 passes through the filter 46 to be amplified by the amplifier 47 to be input to the comparator 48.

Referring to FIG. 1, according to the input device 1, the piezoelectric sensor 30 having the layered structure of FIG. 6 is stacked on and bonded to the front surface of the capacitive sensor 10 facing forward (in the Z1 direction), namely, the front surface 13a of the front-side insulating layer 13 depicted in FIG. 4. The piezoelectric sensor 30 may be bonded with either the film substrate 31 or the insulating coat 38 covering the second electrodes 34 facing the front surface 13a.

Figure 8:
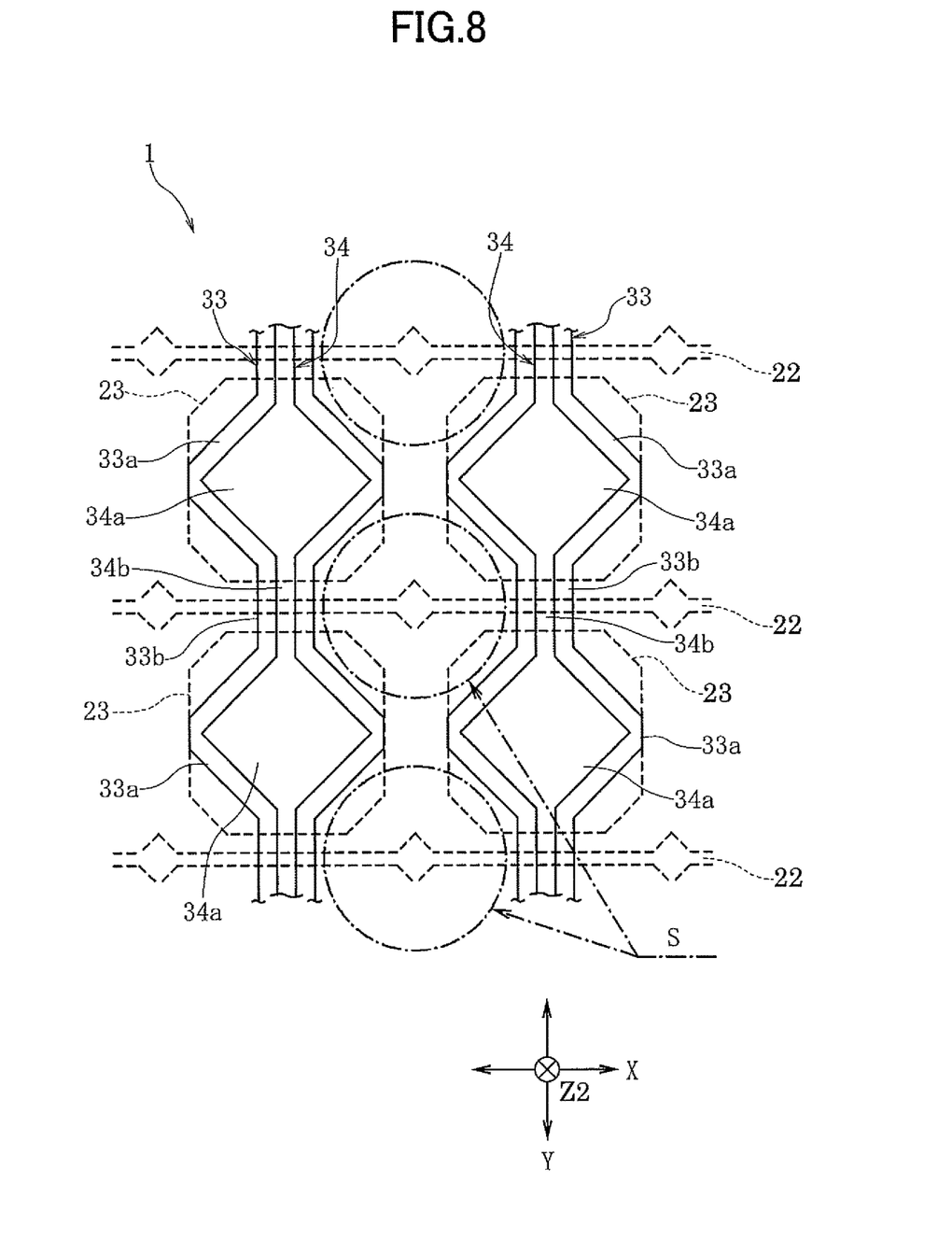
FIG. 8 is an enlarged front view of the piezoelectric sensor placed on the capacitive sensor.

FIG. 8 illustrates how electrodes are positioned one over another in a view in the front-to-back (Z2) direction when the piezoelectric sensor 30 is placed on the capacitive sensor 10. The first electrodes 32, the piezoelectric patterns 33, and the second electrodes 34 of the piezoelectric sensor 30 are placed over and along the drive electrodes 21 or the sense electrodes 22 among the electrodes for capacitive sensing of the capacitive sensor 10 on their front side. According to this embodiment, all of the first electrodes 32, the piezoelectric patterns 33, and the second electrodes 34 are placed over and along all the drive electrodes 21 on their front side.

Here, the first electrodes 32 and the second electrodes 34 of the piezoelectric sensor 30 are equal in shape and size, and are completely superimposed in the Z direction. Referring to FIG. 8, the wide portions of the first electrodes 32 (not depicted) and the wide portions 34a of the second electrodes 34, which are hereinafter collectively referred to "wide portions 34a", are placed over the main electrode parts 21a of the drive electrodes 21 and over the conductive patterns 23, positioned over the drive electrodes 21, on the front side of the conductive patterns 23.

Preferably, the wide portions 34a of the first electrodes 32 and the second electrodes 34 are not spreading out of the main electrode parts 21a or the conductive patterns 23 in a plan view (a view in the Z direction). In contrast, it is preferable that either or both of the main electrode parts 21a and the conductive patterns 23 capacitively coupled to the main electrode parts 21a be equal in shape and size (area) to the wide portions 34a of the first electrodes 32 and the second electrodes 34 or that either or both of the main electrode parts 21a and the conductive patterns 23 be greater (in area) than the wide portions 34a of the first electrodes 32 and the second electrodes 34 to spread out of the wide portions 34a in a plan view.

Next, an operation of the input device 1 is described. In the following, the first electrodes 32 and the second electrodes 34 are also collectively referred to as "first electrode 32" and "second electrode 34," respectively, where appropriate. In the input device 1, the drive and detection circuit 44 illustrated in FIG. 7 is constantly in operation. The reference voltage Vref is applied to one of the first electrode 32 and the second electrode 34, and a change in electric potential at the other of the first electrode 32 and the second electrode 34 passes through the filter 46 to be amplified by the amplifier 47 to be input to the comparator 48.

Figure 9:
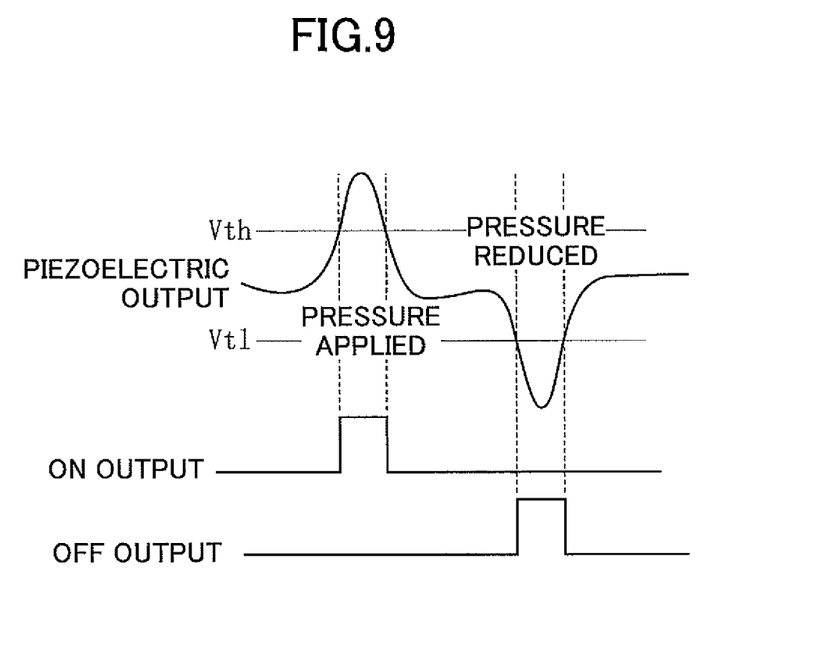
FIG. 9 is a diagram illustrating an operation of the piezoelectric sensor.

At the top of FIG. 9, a change in the voltage between the first electrode 32 and the second electrode 34 at a time when the front surface of the surface sheet 40 is pressed at a point with a finger or the like from the front side (in the Z2 direction) (at a time when pressure is applied) and a change in the voltage between the first electrode 32 and the second electrode 34 at a time when the finger is released from the front surface of the surface sheet 40 (at a time when pressure is reduced) are illustrated as piezoelectric output. The piezoelectric output illustrated in FIG. 9 changes in accordance with variations in the flexural acceleration of the entire piezoelectric sensor 30. As illustrated at the bottom of FIG. 9, a voltage change obtained at a positive acceleration is subjected to waveform shaping in the comparator 48 to be output as ON output, and a voltage change obtained at a negative acceleration is subjected to waveform shaping in the comparator 48 to be output as OFF output.

The input device 1 includes a control part (not depicted) that detects the pressing of the input device 1 with a finger or the like when the ON output illustrated at the bottom of FIG. 9 is obtained and detects the release of a finger or the like from the input device 1 when the OFF output illustrated at the bottom of FIG. 9 is obtained.

Referring to FIG. 8, the wide portions 34a of the first electrode 32 and the second electrode 34 of the piezoelectric sensor 30 are formed with a relatively large area over the surfaces of the conductive patterns 23. Therefore, it is possible to ensure that the area of each of the first electrode 32 and the second electrode 34 is 20% or more, and preferably, 30% or more of the entire area of an operation region (surface) that is the front surface of the surface sheet 40. Therefore, it is possible to increase the detection sensitivity of the piezoelectric sensor 30.

Referring to FIG. 8, the wide portions 34a of the first electrode 32 and the second electrode 34 have a rhombic shape whose sides each extend at an angle relative to the X direction or the Y direction, and the conductive patterns 23 have a quadrangular shape whose sides each extend in the X direction or the Y direction. Therefore, when viewed from the front side (namely, in the front-to-back (Z2) direction), the four corners of each conductive pattern 23 spreads out of the wide portions 34a of the first electrode 32 and the second electrode 34. Furthermore, each sense electrode 22 extends in the X direction between the adjacent conductive patterns 23.

Referring to FIG. 8, in the capacitive sensor 10, regions where the wide portions 34a of the first electrode 32 and the second electrode 34 of the piezoelectric sensor 30 are absent serve as main capacitive sensing areas S. That is, the wide portions 34a do not overlap the capacitive sensing areas S when viewed from the front side or projected onto a plane parallel to the X-Y plane. Each capacitive sensing area S is a region surrounded by four of the wide portions 34a. Each capacitive sensing area S is surrounded at four points on its periphery by four corners of four of the conductive patterns 23 spreading out of the four wide portions 34a. One of the sense electrodes 22 passes through the center of each capacitive sensing area S. That is, each capacitive sensing area S is preferably set in a region around which four of the drive electrodes 21 or four of the conductive patterns 23 coupled to the drive electrodes 21 are positioned and where one of the sense electrodes 22 passes when viewed from the front side.

According to the capacitive sensor 10, a drive voltage is applied to the drive electrodes 21 in order. Because the main electrode parts 21a of the drive electrodes 21 and the conductive patterns 23 in a floating state are coupled through capacitance, an electric field from the conductive patterns 23 to the sense electrodes 22 is formed in front of the surface sheet 40 of the input device 1 in the capacitive sensing areas S. Therefore, by monitoring the sense electrodes 22 in order for a change in the value of an electric current flowing through the sense electrodes 22, it is possible to detect the coordinate position of a finger touching the front surface of the surface sheet 40 with relatively high sensitivity.

Referring to FIG. 8, the first electrode 32 and the second electrode 34 of the piezoelectric sensor 30 are placed over and along the drive electrodes 21 of the capacitive sensor 10 and the wide portions 34a of the first electrode 32 and the second electrode 34 of the piezoelectric sensor 30 are placed over the wide main electrode parts 21a of the drive electrodes 21 and the conductive patterns 23. This makes it possible to enlarge the occupied area of each of the first electrode 32 and the second electrode 34 as much as possible to increase the detection sensitivity of the piezoelectric sensor 30. Furthermore, by causing the main electrode parts 21a or the conductive patterns 23 coupled to the main electrode parts 21a to spread out of the first electrode 32 and the second electrode 34, regions where the first electrode 32 and the second electrode 34 are absent can be set as the capacitive sensing areas S where the detection sensitivity is high.

Figure 10A:
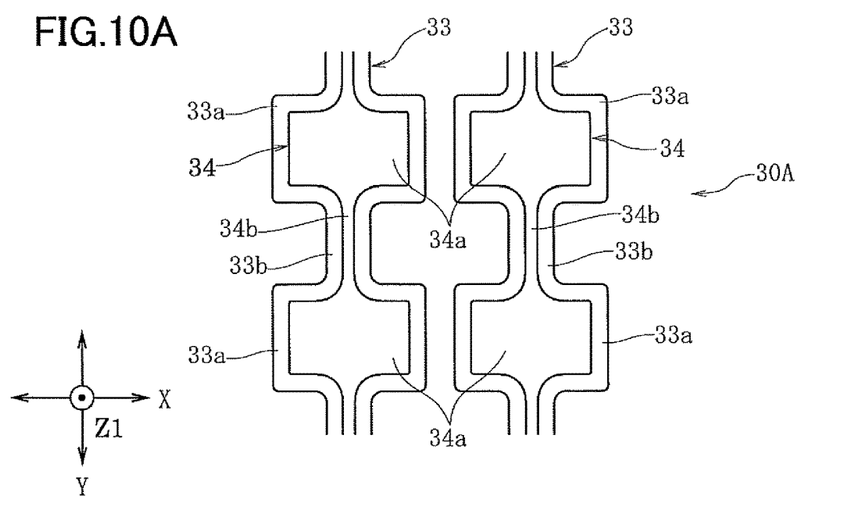
FIGS. 10A, 10B and 10C are enlarged front views of variations of the electrode pattern of the piezoelectric sensor.
Figure 10B:
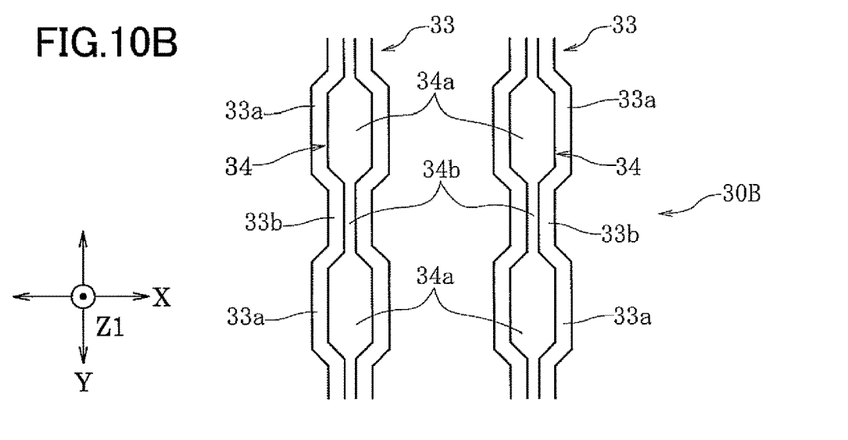
Figure 10C:
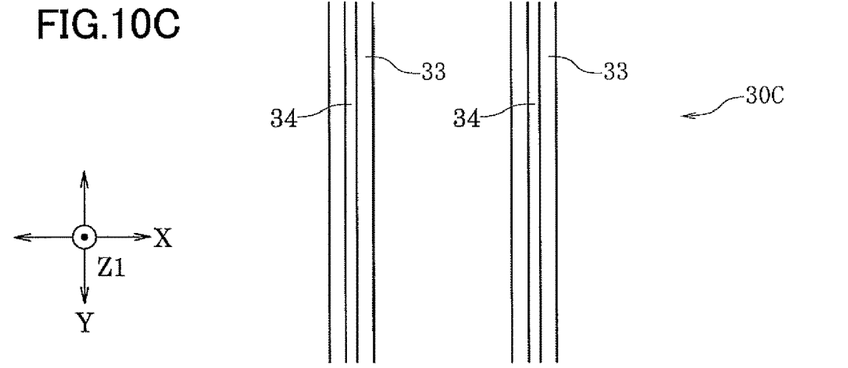

FIGS. 10A, 10B and 10C illustrate variations of the piezoelectric sensor 30. In the following description, the piezoelectric patterns 33 as well are collectively referred to as "piezoelectric pattern 33" where appropriate. According to a piezoelectric sensor 30A illustrated in FIG. 10A, the wide portions 33a of the piezoelectric pattern 33 and the wide portions 34a of the first electrode 32 and the second electrode 34 have a quadrangular (rectangular) shape whose sides each extending in the X direction or the Y direction. According to a piezoelectric sensor 30B illustrated in FIG. 10B, the wide portions 33a of the piezoelectric pattern 33 and the wide portions 34a of the first electrode 32 and the second electrode 34 are slightly reduced in width (the dimension in the X direction). According to a piezoelectric sensor 30C illustrated in FIG. 10C, each of the piezoelectric pattern 33, the first electrode 32, and the second electrode 34 has a stripe shape of uniform width (the dimension in the X direction).

According to this embodiment, the occupied area of each of the first electrode 32 and the second electrode 34 is 20% or more, and preferably, 30% or more of the entire area of the operation surface, and the area of the capacitive sensing areas S is 40% or more, and preferably, 50% or more of the entire area of the operation surface. As a result, it is possible to increase the detection sensitivity of each of the capacitive sensor 10 and the piezoelectric sensor 30.

According to the input device 1 of this embodiment, as illustrated in FIG. 4, the capacitive sensor 10 forms a multilayer rigid substrate, and the piezoelectric sensor 30 is a sheet-shaped sensor including the film substrate 31. By placing the sheet-shaped piezoelectric sensor 30 on the capacitive sensor 10 having a rigid structure, the layered body of the capacitive sensor 10 and the piezoelectric sensor 30 has appropriate rigidity, and has appropriate flexural strength that allows the piezoelectric sensor 30 to detect pressing when pressed with a finger or the like, compared with the case where the capacitive sensor and the piezoelectric sensor both have a rigid structure or a sheet structure.

Furthermore, the sheet-shaped piezoelectric sensor 30 is placed on the rigid capacitive sensor 10 on its front side.

Therefore, when flexing in response to the application of a force from the front side, the piezoelectric sensor 30 can flex with a large curvature to have higher sensitivity and better follow changes in the pressing force. At this point, the sheet-shaped piezoelectric sensor 30 can flexibly follow the flexural deformation of the rigid capacitive sensor 10.

Furthermore, as illustrated in FIG. 4, the wiring layer 16 is provided and an IC, etc., are placed on the back surface of the capacitive sensor 10 facing in the Z2 direction. Therefore, it is difficult to place the planar piezoelectric sensor 30 on the back side of the capacitive sensor 10. In contrast, the front surface of the capacitive sensor 10 facing in the Z1 direction is a flat surface, thus facilitating the placement of the thin planar piezoelectric sensor 30.

According to the above-described embodiment, while the conductive patterns 23 in a floating state are formed in the same layer as the sense electrodes 22 in the capacitive sensor 10 as depicted in FIGS. 3 and 4, the conductive patterns 23 may alternatively be omitted. In this case, as illustrated in FIG. 8, it is preferable that the main electrode parts 21a of the drive electrodes 21 be equal in shape and size to the wide portions 34a of the first electrodes 32 and the second electrodes 34 or the main electrode parts 21a be sized to spread out of the wide portions 34a of the first electrodes 32 and the second electrodes 34 when the capacitive sensor 10 and the piezoelectric sensor 30 are placed one over the other. This structure makes it possible to increase the sensitivity of the capacitive sensor 10 in the capacitive sensing areas S.

In addition, according to embodiments of the present invention, the drive and detection circuit 44 is not limited to the structure depicted in FIG. 7. For example, the potential difference between the first electrode 32 and the second electrode 34 (piezoelectric output) may be input to an analog-to-digital (A/D) conversion part of a microcomputer to be subjected to operations without using the multiplexer 45 and the comparator 48. Alternatively, the potential difference between the first electrode 32 and the second electrode 34 (piezoelectric output) may be input to an analog detection circuit as analog data.

Thus, according to an aspect of the present invention, a piezoelectric sensor is provided on the front side of a capacitive sensor. Therefore, when the capacitive sensor and the piezoelectric sensor flex in response to the application of a pressing force from the front side, a larger curvature acts on the piezoelectric sensor. Accordingly, it is possible to increase the sensitivity of detecting a pressing force.

For example, by placing a first electrode and a second electrode of the piezoelectric sensor over and along a drive electrode of the capacitive sensor on its front side, it is possible to ensure that the capacitive sensor has sufficiently high sensitivity even with the piezoelectric sensor, so that it is possible to strike a good balance between the detection sensitivity of the piezoelectric sensor and the detection sensitivity of the capacitive sensor.

In addition, by placing the piezoelectric sensor on the front side of the capacitive sensor, a wiring layer and electronic components can easily be provided on the back surface of the capacitive sensor.

All examples and conditional language provided herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

What is claimed is:

1. An input device comprising:
a capacitive sensor; and
a piezoelectric sensor positioned on a front side of the capacitive sensor in a front-to-back direction from a front to a back of the input device, the piezoelectric sensor being configured to change an output thereof in response to a force applied to the piezoelectric sensor from a front side thereof,
wherein the piezoelectric sensor includes
a piezoelectric layer; and
a first electrode and a second electrode positioned across the piezoelectric layer from each other in the front-to-back direction,
wherein the capacitive sensor includes a capacitive sensing area where the capacitive sensor is configured to perform a sensing operation, and the first electrode and the second electrode of the piezoelectric sensor do not overlap the capacitive sensing area when viewed in the front-to-back direction,
wherein the capacitive sensor includes a plurality of drive electrodes and a plurality of sense electrodes that cross each other with an insulating layer being interposed between the plurality of drive electrodes and the plurality of sense electrodes,
wherein the plurality of sense electrodes are positioned within the capacitive sensing area,
wherein the first electrode and the second electrode are placed along one of the plurality of drive electrodes on a front side of the plurality of drive electrodes,
wherein the first electrode and the second electrode include respective wide portions where the first electrode and the second electrode increases in width, and
wherein the first electrode and the second electrode are over the one of the plurality of drive electrodes in the respective wide portions.

2. The input device as claimed in claim 1, wherein
the plurality of drive electrodes include respective electrode parts where the plurality of drive electrodes increase in width, and
the electrode parts are equal in size to the wide portions of the first electrode and the second electrode, or are sized to spread out of the wide portions when viewed in the front-to-back direction.

3. The input device as claimed in claim 1, wherein
the capacitive sensor has a rigid structure configured to perform flexural deformation, and
the piezoelectric sensor has a sheet shape, and further includes a film substrate on which the first electrode, the piezoelectric layer, and the second electrode are stacked in layers.

4. An input device comprising:
a capacitive sensor; and
a piezoelectric sensor positioned on a front side of the capacitive sensor in a front-to-back direction from a front to a back of the input device, the piezoelectric sensor being configured to change an output thereof in response to a force applied to the piezoelectric sensor from a front side thereof,
wherein the piezoelectric sensor includes
a piezoelectric layer; and
a first electrode and a second electrode positioned across the piezoelectric layer from each other in the front-to-back direction, wherein the capacitive sensor includes a capacitive sensing area where the capacitive sensor is configured to perform a sensing operation, and the first electrode and the second electrode of the piezoelectric sensor do not overlap the capacitive sensing area when viewed in the front-to-back direction, wherein the capacitive sensor includes a plurality of drive electrodes and a plurality of sense electrodes that cross each other with an insulating layer being interposed between the plurality of drive electrodes and the plurality of sense electrodes, wherein the plurality of sense electrodes are positioned within the capacitive sensing area, wherein the first electrode and the second electrode are placed along one of the plurality of drive electrodes on a front side of the plurality of drive electrodes, wherein the plurality of drive electrodes are provided on a back side of the insulating layer and the plurality of sense electrodes are provided on a front side of the insulating layer in the front-to-back direction, wherein the capacitive sensor further includes a conductive layer provided between adjacent sense electrodes among the plurality of sense electrodes on the front side of the insulating layer, the conductive layer being electrically disconnected from the plurality of drive electrodes and the plurality of sense electrodes, and wherein the first electrode and the second electrode are on a front side of the conductive layer in the front-to-back direction.

5. The input device as claimed in claim 4, wherein
the plurality of sense electrodes and the conductive layer are formed of a same conductive material, and
front surfaces of the plurality of sense electrodes that face in a back-to-front direction from the back to the front of the input device and a front surface of the conductive layer that faces in the back-to-front direction are positioned in a same plane.

6. The input device as claimed in claim 4, wherein
the first electrode and the second electrode include respective wide portions where the first electrode and the second electrode increases in width, and
the first electrode and the second electrode are over the conductive layer in the respective wide portions.

7. The input device as claimed in claim 4, wherein the conductive layer is equal in size to the wide portions of the first electrode and the second electrode, or is sized to spread out of the wide portions when viewed in the front-to-back direction.

8. The input device as claimed in claim 4, wherein
the capacitive sensor has a rigid structure configured to perform flexural deformation, and
the piezoelectric sensor has a sheet shape, and further includes a film substrate on which the first electrode, the piezoelectric layer, and the second electrode are stacked in layers.

* * * * *